(12) United States Patent
Chiu et al.

(10) Patent No.: US 7,271,649 B2
(45) Date of Patent: Sep. 18, 2007

(54) DC OFFSET CALIBRATION APPARATUS

(75) Inventors: Chinq-Shiun Chiu, Hsin-Chu (TW); Chih-Hsien Shen, Kao-Hsiung (TW); Shou-Tsung Wang, Hsin-Ying (TW); Chi-Kun Chiu, Ping-Cheng (TW)

(73) Assignee: Mediatek Inc., Hsin-Chu Hsien (TW)

( * ) Notice: Subject to any disclaimer, the term of this patent is extended or adjusted under 35 U.S.C. 154(b) by 231 days.

(21) Appl. No.: 11/162,897

(22) Filed: Sep. 27, 2005

(65) Prior Publication Data
US 2006/0077003 A1    Apr. 13, 2006

(30) Foreign Application Priority Data
Oct. 8, 2004    (TW) .............................. 93130679 A

(51) Int. Cl.
*H03F 1/02*    (2006.01)
(52) U.S. Cl. .................. 330/9; 330/2; 330/307
(58) Field of Classification Search .................. 330/9, 330/2, 307
See application file for complete search history.

(56) References Cited

U.S. PATENT DOCUMENTS

| 4,835,535 | A | * | 5/1989 | Shibayama et al. | ......... 341/120 |
| 5,789,974 | A | * | 8/1998 | Ferguson et al. | ............... 330/2 |
| 5,867,777 | A | * | 2/1999 | Yamaji et al. | ........... 455/234.1 |
| 6,225,848 | B1 | | 5/2001 | Tilley et al. | |
| 6,316,992 | B1 | * | 11/2001 | Miao et al. | ..................... 330/2 |
| 6,356,217 | B1 | | 3/2002 | Tilley et al. | |
| 7,019,504 | B2 | * | 3/2006 | Pullen et al. | ............... 323/283 |
| 7,026,866 | B2 | * | 4/2006 | Llewellyn | ...................... 330/9 |

* cited by examiner

*Primary Examiner*—Patricia Nguyen
(74) *Attorney, Agent, or Firm*—Winston Hsu

(57) ABSTRACT

A DC offset calibration device for calibrating a DC offset of an output signal of a gain stage, the DC offset calibration device includes: a digital-to-analog converter (DAC) electrically connected to the gain stage for generating an offset current according to the DC offset of the output signal of the gain stage; and a current-to-current converter electrically connected to the DAC and the gain stage for reducing the signal scale of the offset current to generate a compensation signal so as to reduce the DC offset at the output of the gain stage.

23 Claims, 10 Drawing Sheets

DC OFFSET CALIBRATION APPARATUS

BACKGROUND

The present invention relates to DC offset calibration apparatus, and more particularly, to DC offset calibration apparatus for calibrating a DC offset of a gain stage.

In wireless communication applications, a super-heterodyne architecture is widely utilized in conventional RF transceivers. The super-heterodyne transceiver utilizes a costly and volume-consume IF SAW filter to improve performance. This results in increased cost and complexity in system designs.

Recently, in many RF transceivers, the super-heterodyne architecture is replaced with another architecture called "direct conversion" to solve the aforementioned drawbacks. The direct conversion architecture, which is also known as zero IF architecture, directly converts an incoming RF signal into a base-band signal. In contrast to the conventional super-heterodyne architecture, the direct conversion transceiver does not require certain components such as costly SAW filters, IF to base-band converting circuits, and image reject filters. Therefore, the required cost and volume are reduced.

However, the undesirable DC offset more apparently affects the performance of the direct conversion transceiver. The DC offset will distort the output signal of mixers of the transceiver in the frequency band of interested. Then the distorted output signal might saturate the following signal stages such as the analog-to-digital converter (ADC) and degrade the performance of the receiver.

In U.S. Pat. No. 6,225,848, entitled: "Method and Apparatus for Settling and Maintaining DC Offset" and U.S. Pat. No. 6,356,217, entitled: "Enhanced DC Offset Correction Through Bandwidth and Clock Speed Selection," Tilley et al. disclose architectures for calibrating the DC offset in a radio receiver by utilizing a DC offset correcting loop. In the disclosed DC offset correcting loop, a binary search algorithm is employed to adjust the output voltage of a digital-to-analog converter (DAC) to achieve the DC offset correction. Furthermore, additional voltage DACs and operational transconductance amplifiers (OTAs) are required to improve accuracy of the DC offset correction.

Unfortunately, the correction precision is restricted by the resolution of the voltage DAC. The fine enough resolution of the voltage DAC is hard to achieve, thus the implementation of the transceiver will be compromised to be more costly.

SUMMARY

It is therefore an objective of the claimed invention to provide DC offset calibration devices having improved DC offset correction precision, thus reduce the hardware cost of the transceiver.

According to an exemplary embodiment of the claimed invention, a DC offset calibration device for calibrating a DC offset at an output signal of a gain stage is disclosed comprising: a digital-to-analog converter (DAC) electrically connected to the gain stage for generating a current according to the DC offset at the output of the gain stage; and a current-to-current converter electrically connected to the DAC and the gain stage for reducing the signal scale of the current to generate a compensation signal so as to alleviate the DC offset at the output signal of the gain stage.

According to an exemplary embodiment of the claimed invention, a DC offset calibration device for calibrating a DC offset of an output signal of a gain stage is disclosed comprising: a digital-to-analog converter (DAC) electrically connected to the gain stage for generating a current according to the DC offset of the output signal of the gain stage; and a first current-to-current converter electrically connected to the DAC and the gain stage for reducing the signal scale of the current to generate a first compensation signal; and a second current-to-current converter electrically connected to the DAC and the gain stage for generating a second compensation signal according to a reference current; wherein the first and second compensation signals are employed to alleviate the DC offset at the output of the gain stage.

An exemplary embodiment of a DC offset calibration device for calibrating a DC offset of a gain stage is also disclosed comprising: a first digital-to-analog converter (DAC) electrically connected to the gain stage for generating a first current according to the DC offset of signals output from the gain stage; a first current-to-current converter electrically connected to the first DAC and the gain stage for reducing the signal scale of the first current to generate a first compensation signal; a second DAC electrically connected to the gain stage for generating a second current according to the DC offset of signals output from the gain stage; and a second current-to-current converter electrically connected to the second DAC and the gain stage for reducing the signal scale of the second current to generate a second compensation signal; wherein the first and second compensation signals are employed to alleviate the DC offset of signals output from the gain stage.

Another advantage of the claimed invention is that the DC offset calibration precision is improved by utilizing the current-to-current converter to reduce the signal scale of the output current of the current DAC.

These and other objectives of the claimed invention will no doubt become obvious to those of ordinary skill in the art after reading the following detailed description of the preferred embodiment that is illustrated in the various figures and drawings.

DETAILED DESCRIPTION

The DC offset calibration apparatus of the present invention not only feasible for various signal receivers and transceivers that adopting either the direct conversion architecture or the super-heterodyne architecture but also feasible for other electronic apparatus that need to calibrate the DC offset thereof. For convenient descriptions, RF signal receivers are employed as examples for illustrating the architectures and operations of the DC offset calibration apparatus of the present invention. Note that, the following embodiments are merely utilized for descriptions and not intended to limit the applications of the present invention.

Figure 1:
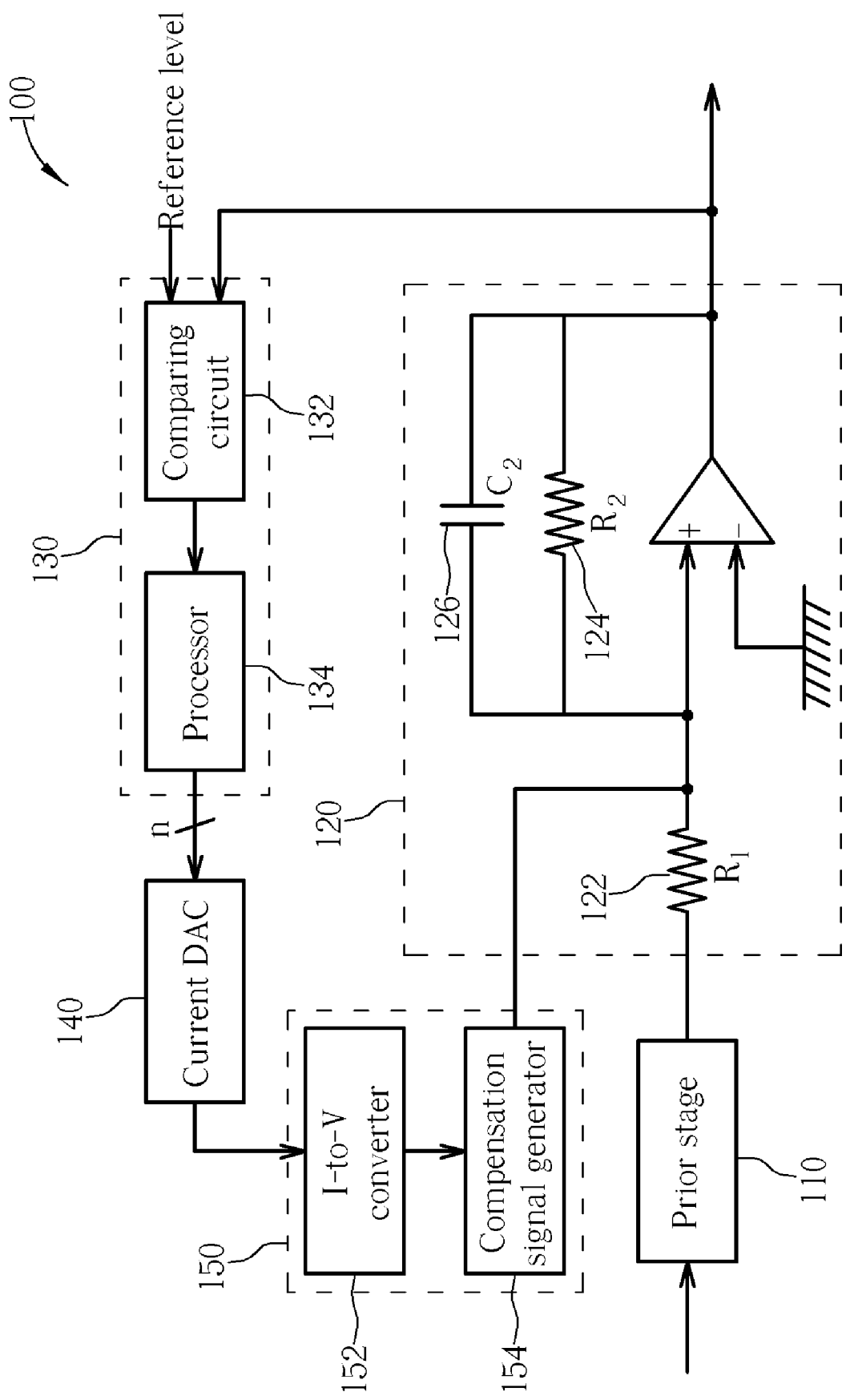
FIG. 1 is a simplified block diagram of a signal receiver applying a DC offset calibration device according to a first embodiment of the present invention.

A first embodiment of the present invention is as in FIG. 1, which shows a simplified block diagram of a signal receiver 100 applying a DC offset calibration device. The signal receiver 100 comprises a prior stage 110 and a gain stage 120. In a direct conversion receiver, the prior stage 110 typically comprises a mixer for down-converting the frequency of a received signal to base-band. In practice, the prior stage 110 may be another gain stage. As shown in FIG. 1, the gain stage 120 is a single-end gain stage. A resistance $R_2$ of a resistor 124 and a resistance $R_1$ of a resistor 122 determine the gain of the gain stage 120. The bandwidth of the gain stage 120 is decided by the resistance $R_2$ of the resistor 124 and a capacitance $C_2$ of a capacitor 126.

In this embodiment, the DC offset device comprises a control circuit 130, a current digital-to-analog converter (DAC) 140, and a current-to-current (I-to-I) converter 150. In operation, with no signal applied to the input of the prior stage 110, there is a DC offset present at the output of the prior stage 110. The gain stage 120 then amplifies the DC offset at the output of the prior stage 110 so that the following stage may be saturated accordingly and thereby affecting the system performance. In this embodiment, the control circuit 130 is arranged for generating an n-bit digital control signal according to the DC offset at the output signal of the gain stage 120. The current DAC 140 is arranged for generating an offset current according to the digital control signal. The I-to-I converter 150 is utilized for reducing the signal scale of the offset current output from the current DAC 140 to generate a compensation signal. The compensation signal is then feedback to an input of the gain stage in order to alleviate the DC offset at the output signal of the gain stage 120.

By utilizing the I-to-I converter 150 to reduce the signal scale of the offset current, the signal precision for calibrating the DC offset of the gain stage is thus improved. The improvement of the signal precision for calibrating the DC offset of the gain stage makes it possible to down size the components of the gain stage 120 thereby reducing the implementation area and cost of the gain stage 120. Additionally, the cost of the current DAC 140 can be reduced due to the resolution requirement of the output signal of the current DAC 140 is released. The further operations of the DC offset calibration device are described in blow.

As mentioned above, the control circuit 130 generates an n-bit digital control signal according to the DC offset at the output of the gain stage 120. In a preferred embodiment, the control circuit 130 further comprises a comparing circuit 132 and a processor 134 for generating the n-bit digital control signal. The comparing circuit 132 is utilized for comparing the output signal of the gain stage 120 with a reference level. The comparing circuit 132 may be a comparator, a limiter, an analog-to-digital converter (ADC), or a like. Preferably, the comparing circuit 132 compares the output signal of the gain stage 120 with the reference level when no signal is applied to the prior stage 110. In that moment, the expected level of the output signal of the gain stage 120 is generally zero, i.e., the DC offset is zero. Accordingly, the reference level can be set to be zero.

The processor 134 performs a binary search according to the comparison result of the comparing circuit 132 to sequentially set the n-bit digital control signal bit-by-bit from the MSB to the LSB. Every time the processor 134 set a bit value for the digital control signal, the current DAC 140 then correspondingly adjusts the magnitude of its output current. The current DAC keeps all the bit setting values, until the LSB is set and get the final magnitude of its output current.

In practical implementations, the processor 134 may adjust the configuration method of the digital control signal depends on the architecture of the current DAC 140.

Figure 2:
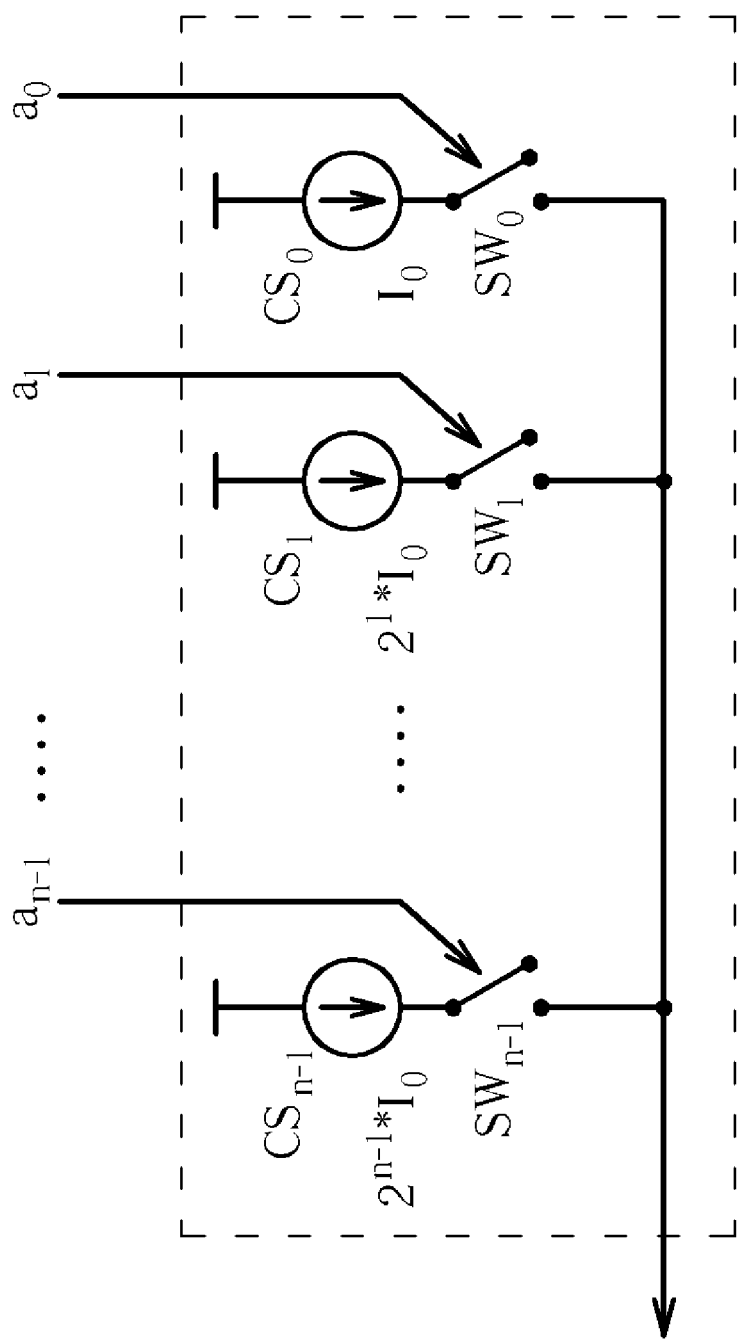
FIG. 2 is a schematic diagram of a current DAC of FIG. 1 according to a first embodiment of the present invention.

A first embodiment of the current DAC 140 is shown in FIG. 2 as an example. In FIG. 2, the digital control signal generated by the processor 134 can be represented as a control bit set $\{a_{n-1}, \ldots a_1, a_0\}$, where $a_{n-1}$ corresponds to the MSB of the digital control signal and $a_0$ corresponds to the LSB. In one embodiment, the processor 134 sequentially set respective bit values $a_m$ of the digital control signal to 0 or 1 and the current DAC 140 correspondingly turn on or off respective switches $SW_m$ corresponding to current sources $CS_m$ so as to adjust the total output current, wherein m=0, 1, ... n−1. In this embodiment, when a control bit value $a_m$ is set to 1, the current DAC 140 turns on the respective switch $SW_m$; when the control bit value $a_m$ is set to 0, the current DAC 140 turns off the switch $SW_m$. As a result, if all the bit values of the control bit set $\{a_{n-1}, \ldots a_1, a_0\}$ are set to 0, the total current generated from the current DAC 140 is 0. If all the bit values of the control bit set $\{a_{n-1}, \ldots a_1, a_0\}$ are set to 1, the total current generated from the current DAC 140 is $$\sum_{m=0}^{n-1} a_m \cdot 2^m \cdot I_0,$$

where $I_0$ is a constant current. In practice, the current sources of the current DAC 140 can be designed to provide negative current. In this situation, when all the bit values of the control bit set $\{a_{n-1}, \ldots a_1, a_0\}$ are set to 1, the total current generated from the current DAC 140 is $$-\sum_{m=0}^{n-1} a_m \cdot 2^m \cdot I_0.$$

In other words, the embodiment of the current DAC 140 shown in FIG. 2 is possible to generate either the positive current or the negative current.

Figure 3:
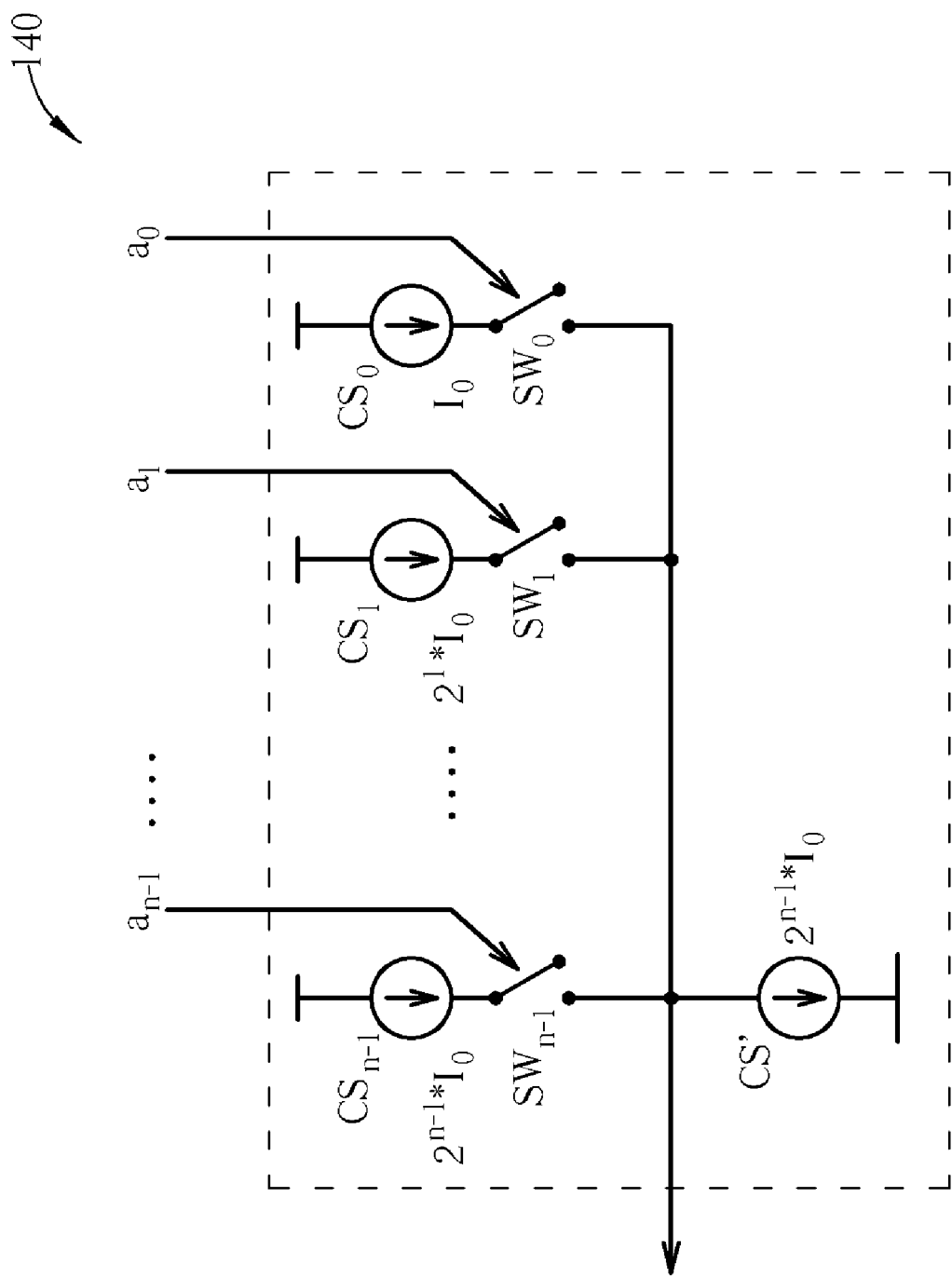
FIG. 3 is a schematic diagram of a current DAC of FIG. 1 according to a second embodiment of the present invention.

A second embodiment of the current DAC 140 is shown in FIG. 3, in which the current DAC 140 comprises a negative current source CS' for providing negative current and a plurality of positive current sources $CS_0 \sim CS_{n-1}$ for providing positive current. In one embodiment, all the bit values of the control bit set $\{a_{n-1}, \ldots a_1, a_0\}$ are set to a initial value 0. Then, the processor 134 sets the control hit set hit-by-bit. For each bit value $a_m$, the processor 134 firstly sets the bit value $a_m$ to 1 and then according to the comparison result of the comparing circuit 132 to determine the bit value $a_m$ to be 0 or 1. The current DAC 140 then accordingly controls a corresponding switch $SW_m$ of a positive current source $CS_m$ to adjust the total output current. In this embodiment, the current DAC 140 turns on a switch $SW_m$ when a corresponding control bit value $a_m$ is set to 1 and turns off the switch $SW_m$ when the control bit value $a_m$ is set to 0. As a result, the total current generated from the current DAC 140 can be represented as $$-2^{n-1} \cdot I_0 + \sum_{m=0}^{n-1} a_m \cdot 2^m \cdot I_0,$$

where $I_0$ is a constant current. It should be appreciated that the architecture shown in FIG. 3 can be modified to be a combination of a positive current source for providing positive current and a plurality of negative current sources for providing negative current. In this scheme, the total current generated from the current DAC 140 is $$2^{n-1} \cdot I_0 - \sum_{m=0}^{n-1} a_m \cdot 2^m \cdot I_0.$$

Figure 4:
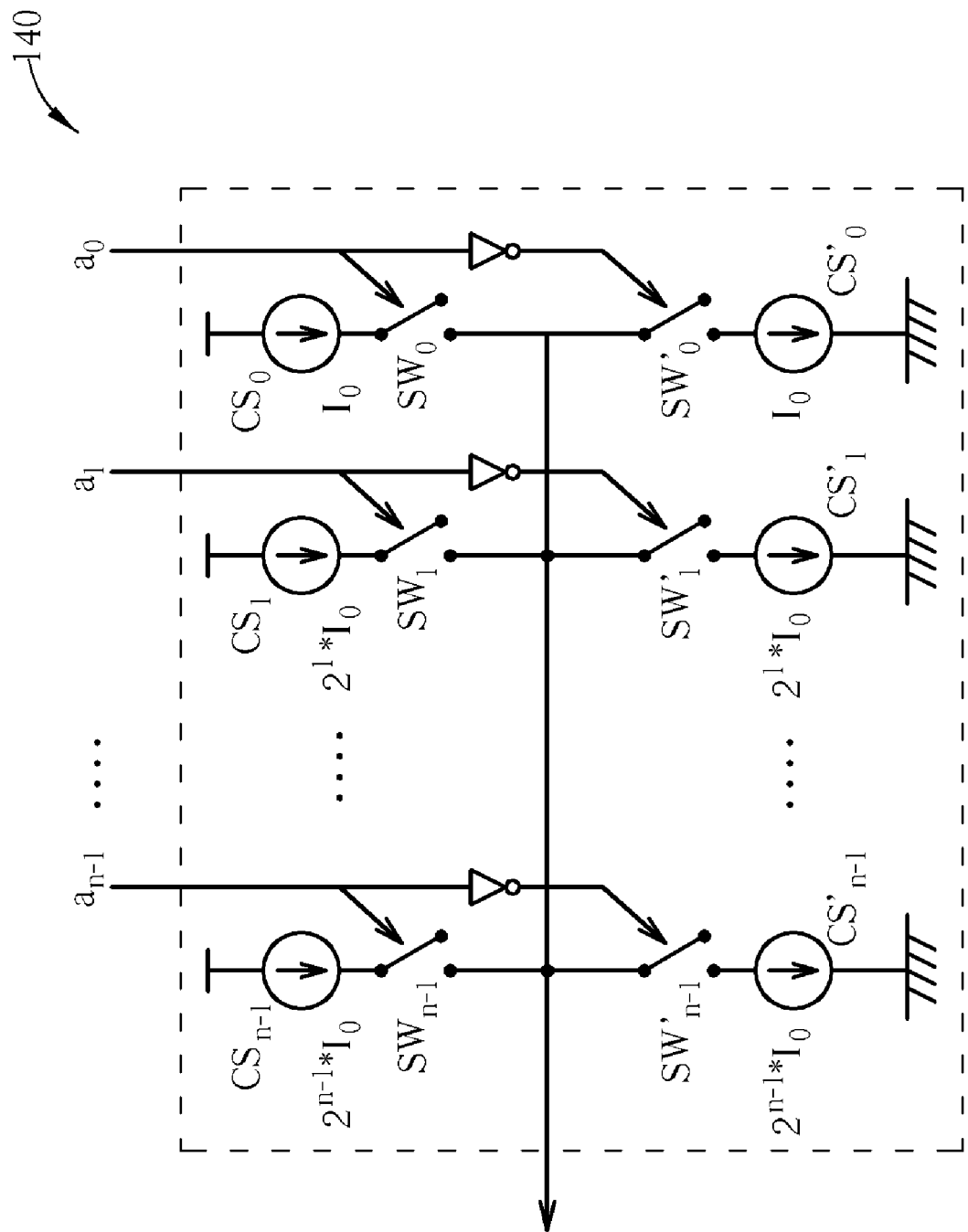
FIG. 4 is a schematic diagram of a current DAC of FIG. 1 according to a third embodiment of the present invention.

A third embodiment of the current DAC 140 is shown in FIG. 4, in which the current DAC 140 comprises a plurality of negative current sources $CS'_0 \sim CS'_{n-1}$ for providing negative current and a plurality of positive current sources $CS_0 \sim CS_{n-1}$ for providing positive current. In a preferred embodiment, the processor 134 respectively sets the bits of the control bit set $\{a_{n-1}, \ldots a_1, a_0\}$ to 1 or $-1$ or 0 so as to control the switches $SW_0 \sim SW_{n-1}$ and $SW'_0 \sim SW'_{n-1}$. In practice, all the bit values can be firstly set to an initial value 0 to turn off all the switches $SW_0 \sim SW_{n-1}$ and $SW'_0 \sim SW'_{n-1}$ of the current DAC 140. Accordingly, the initial output current of the current DAC 140 is zero. In this embodiment, when the bit value $a_{n-1}$ of the MSB is set to 1, the current DAC 140 turns on the switch $SW_{n-1}$ and turns off the switch $SW'_{n-1}$ so as to provide a positive current $2^{n-1}*I_0$. Similarly, when the bit value $a_1$ is set to $-1$, the current DAC 140 turns off the switch $SW_1$ and turns on the switch $SW'_1$ so as to provide a negative current $2^1*I_0$. In this way, if the processor 134 set all the bit values of the control $\{a_{n-1}, \ldots a_1, a_0\}$ to 1, the total current generated from the current DAC 140 is $$\sum_{m=0}^{n-1} 1 \cdot 2^m \cdot I_0.$$

If all the bit values of the control bit set $\{a_{n-1}, \ldots a_1, a_0\}$ are set to $-1$, the total current generated from the current DAC 140 is $$\sum_{m=0}^{n-1} (-1) \cdot 2^m \cdot I_0.$$

In addition to the foregoing embodiments, the processor 134 may be implemented with any other known successive approximation register (SAR) or software that capable of performing the binary search. Further details of such implementations are omitted here since they are well known in the art.

As the first embodiment of the present invention shown in FIG. 1, the I-to-I converter 150 further comprises a current-to-voltage (I-to-V) converter 152 electrically connected to the current DAC 140; and a compensation signal generator 154 electrically connected to the I-to-V converter 152 and the gain stage 120. The I-to-V converter 152 is arranged for converting the output current of the current DAC 140 from current domain to voltage domain and simultaneously amplifying the signal scale. The compensation signal generator 154 is utilized for converting the voltage signal from voltage domain to current domain and simultaneously reducing the signal scale to generate compensation signal with improved precision. The compensation signal is then feedback to the input of the gain stage to alleviate the DC offset of the gain stage 120. Specifically, the compensation signal generator 154 can be implemented with a voltage-to-current (V-to-I) converter such as a resistor unit.

Please note that the I-to-I converter 150 of this embodiment is not simply converts the output current of the current DAC 140 into the voltage domain from the current domain and then converts it back to the current domain. Specifically, the I-to-V converter 152 of the I-to-I converter 150 amplifies the signal scale while converting the current signal into voltage domain. Then, the compensation signal generator 154 reduces the signal scale while converting the voltage signal into current domain. In other words, the I-to-I converter 150 of this embodiment is able to adjust the signal scale of the compensation signal. For example, the compensation signal generator 154 can be implemented by a resistor unit, and the signal scale of compensation signal can be adjusted by changing the resistance of the compensation signal generator 154. Generally, when the resistance of the compensation signal generator 154 is increased, the signal scale of the compensation signal is reduced and thereby increasing the tuning resolution of the compensation signal.

The I-to-I converter 150 converts and reduces the signal scale of the offset current output from the current DAC 140 to produce the compensation signal. In other words, the resolution of the compensation signal becomes finer than the offset current. In addition, the resolution of the compensation signal can also be adjusted by changing the conversion characteristic of the I-to-I converter 150. For example, if the amplification of the I-to-V conversion increases, the following V-to-I conversion with signal scale reduction gets finer resolution.

The operations of the I-to-I converter 150 render the signal scale of the compensation signal generated from the compensation signal generator 154 becomes smaller than the signal scale of the current generated from the current DAC 140. In other words, the resolution of the compensation signal will become higher than the output current of the current DAC 140 through the foregoing processes. The resolution of the compensation signal can be adjusted by changing the amplifying characteristic of the I-to-V converter 152 or by changing the voltage-to-current conversion characteristic of the compensation signal generator 154. In addition, the resolution of the compensation signal can be controlled more accurate by increasing the amplifying scale of the I-to-V converter 152 and employing a compensation signal generator 154 having correspondingly increased resistance.

In practical implementations, a switch (not shown) may be arranged on the signal path between the gain stage 120 and the control circuit 130 so that the signal feedback path can be switched off when the processor 134 completed the configurations of the digital control signal and already get a proper compensation current. Such architecture is also feasible for following embodiments.

Note that the gain stage 120 shown in FIG. 1 is merely an example. In practice, the gain stage 120 may be a filter, a programmable gain amplifier (PGA) and so forth. Moreover, the architecture of the DC offset calibration device shown in FIG. 1 can be applied to simultaneously calibrate the DC offset of plural gain stages.

Figure 5:
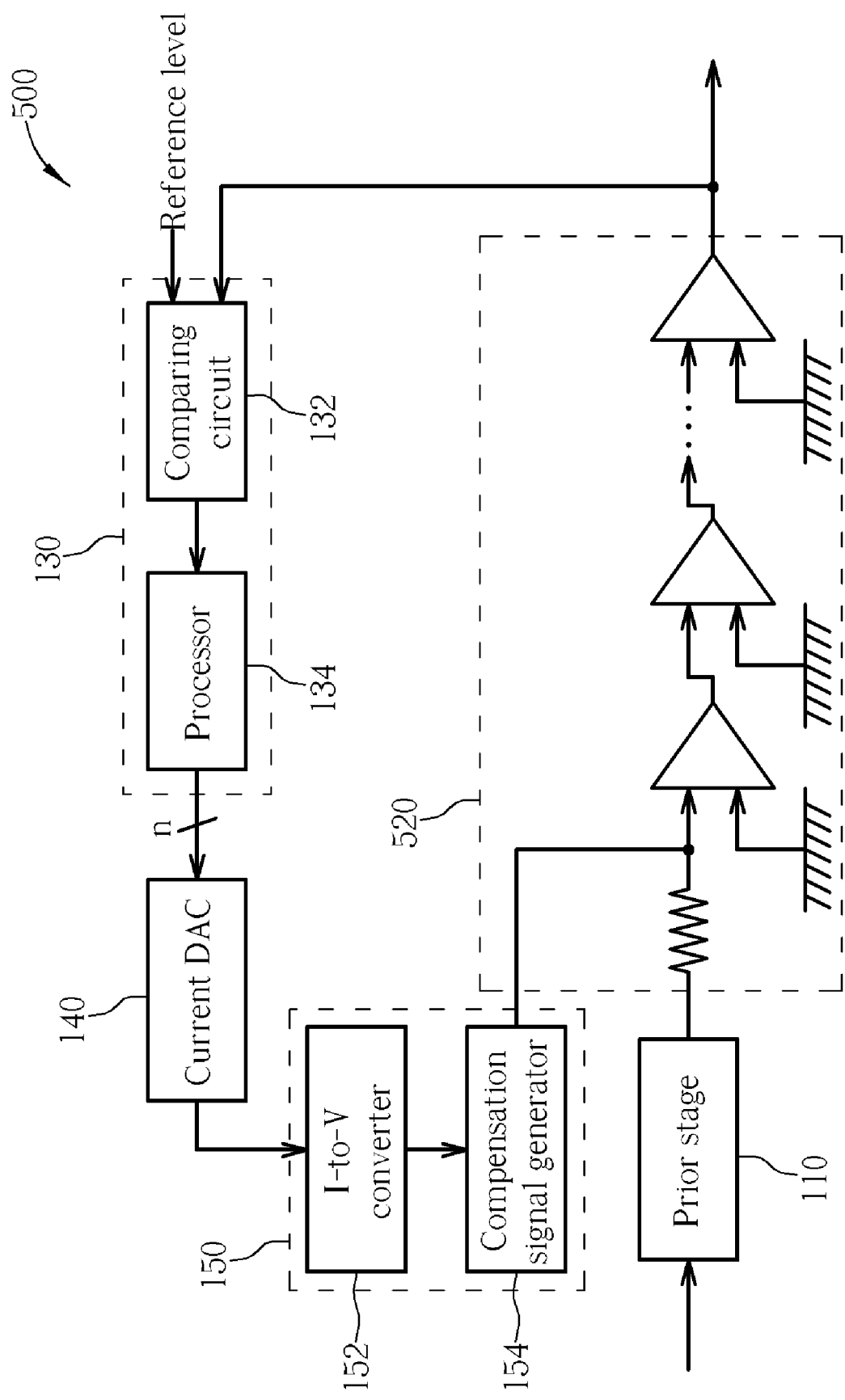
FIG. 5 is a simplified block diagram of a signal receiver applying a DC offset calibration device according to a second embodiment of the present invention.

For example, FIG. 5 shows a simplified block diagram of a signal receiver 500 that applying the DC offset calibration device according to a second embodiment of the present invention. As shown in FIG. 5, the signal receiver 500 is similar to the foregoing signal receiver 100 and the difference between the two receivers is that a gain stage 520 of the signal receiver 500 comprises a plurality of gain stages. In practice, the plurality of gain stages of the gain stage 520 may have different implicit functionalities. In FIG. 5 and FIG. 1, components that labeled with the same number have substantially the same operations and implementations so that further details are omitted for brevity.

Figure 6:
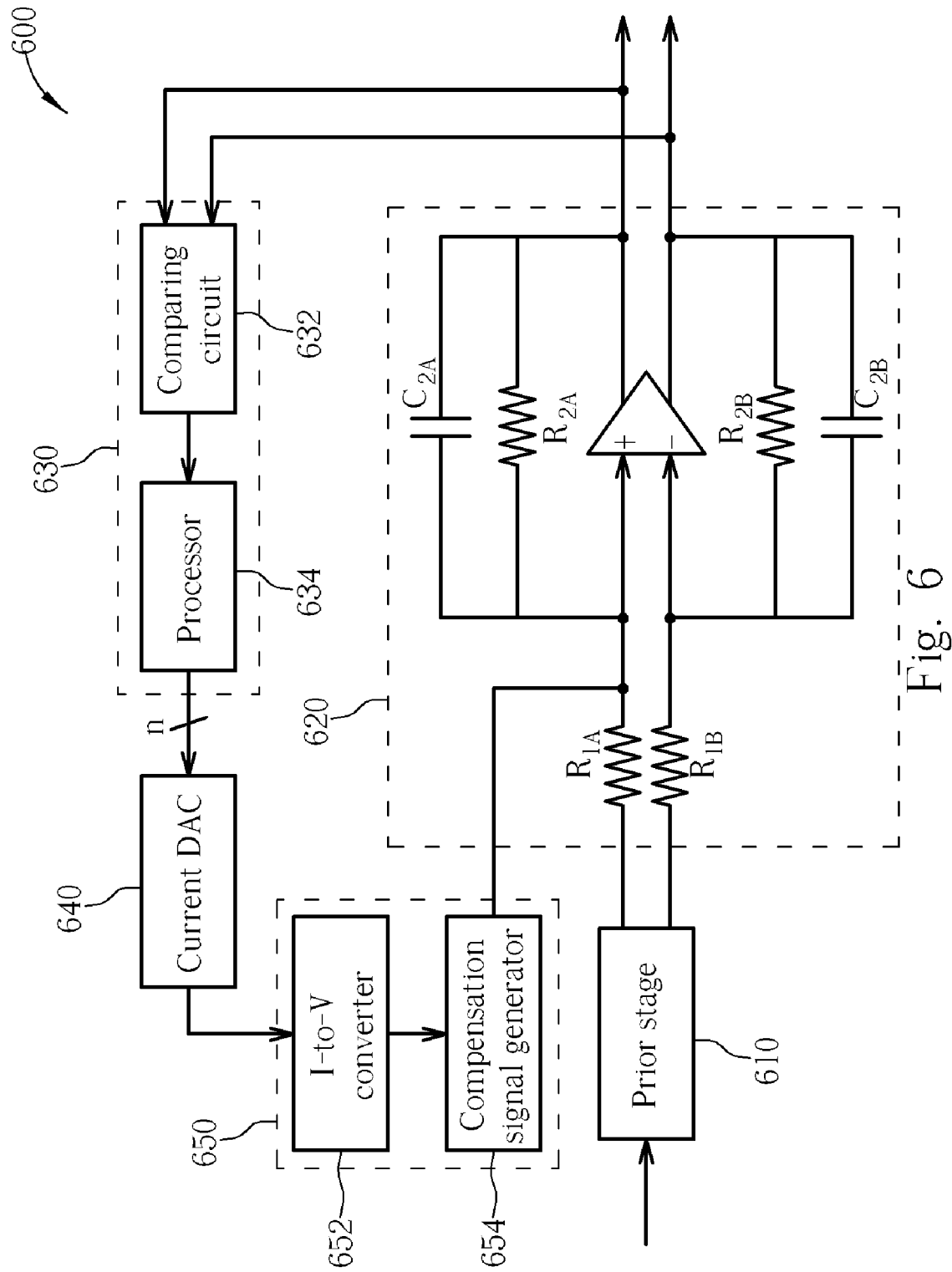
FIG. 6 is a simplified block diagram of a signal receiver applying a DC offset calibration device according to a third embodiment of the present invention.

A third embodiment of the present invention is as FIG. 6, which shows a simplified block diagram of a signal receiver 600 that applying a DC offset calibration device. As shown, the signal receiver 600 comprises a prior stage 610 and a differential gain stage 620. In this embodiment, a DC offset calibration device comprises a control circuit 630, a current DAC 640, and an I-to-I converter 650. The control circuit 630 further comprises a comparing circuit 632 and a processor 634. The I-to-I converter 650 further comprises an I-to-V converter 652 and a compensation signal generator 654. Generally, in the differential gain stage 620, resistors $R_{1A}$ and $R_{1B}$ have identical resistance; resistors $R_{2A}$ and $R_{2B}$ have identical resistance; and capacitors $C_{2A}$ and $C_{2B}$ have identical capacitance.

Since the gain stage 620 of this embodiment is a differential gain stage, the comparing circuit 632 of the control circuit 630 compares two differential signals output from the gain stage 620 to determine the DC offset of the gain stage 620. The operations of the processor 634 and the current DAC 640 are substantially the same as the processor 134 and the current DAC 140 of FIG. 1, and further details are therefore omitted.

Similarly, the I-to-I converter 650 utilizes the I-to-V converter 652 to convert the output current from the current DAC 640 into the voltage domain from the current domain and to simultaneously amplify the signal scale. The compensation signal generator 654 is then employed to convert a voltage signal output from the I-to-V converter 652 into the current domain and to simultaneously reduce the signal scale. As in the foregoing descriptions, such conversion makes the resolution of a compensation signal output from the compensation signal generator 654 become higher than the offset current output from the current DAC 640. In practice, the compensation signal generator 654 may be implemented by a voltage-to-current (V-to-I) converter. For example, the compensation signal generator 654 can be a resistor unit and the resolution of the compensation signal can be adjusted by changing the amplifying characteristics of the I-to-V converter 652 or by changing the resistance of the compensation signal generator 654. The compensation signal generated from the compensation signal generator 654 is employed to compensate one of the two differential input signals of the gain stage 620 so as to calibrate the DC offset of the gain stage 620.

The gain stage 620 shown in FIG. 6 is merely an example. In practice, the gain stage 620 may be various differential gain stages. Similarly, the architecture of the DC offset calibration device shown in FIG. 6 can be applied to simultaneously calibrate the DC offset of a plurality of differential gain stages.

Figure 7:
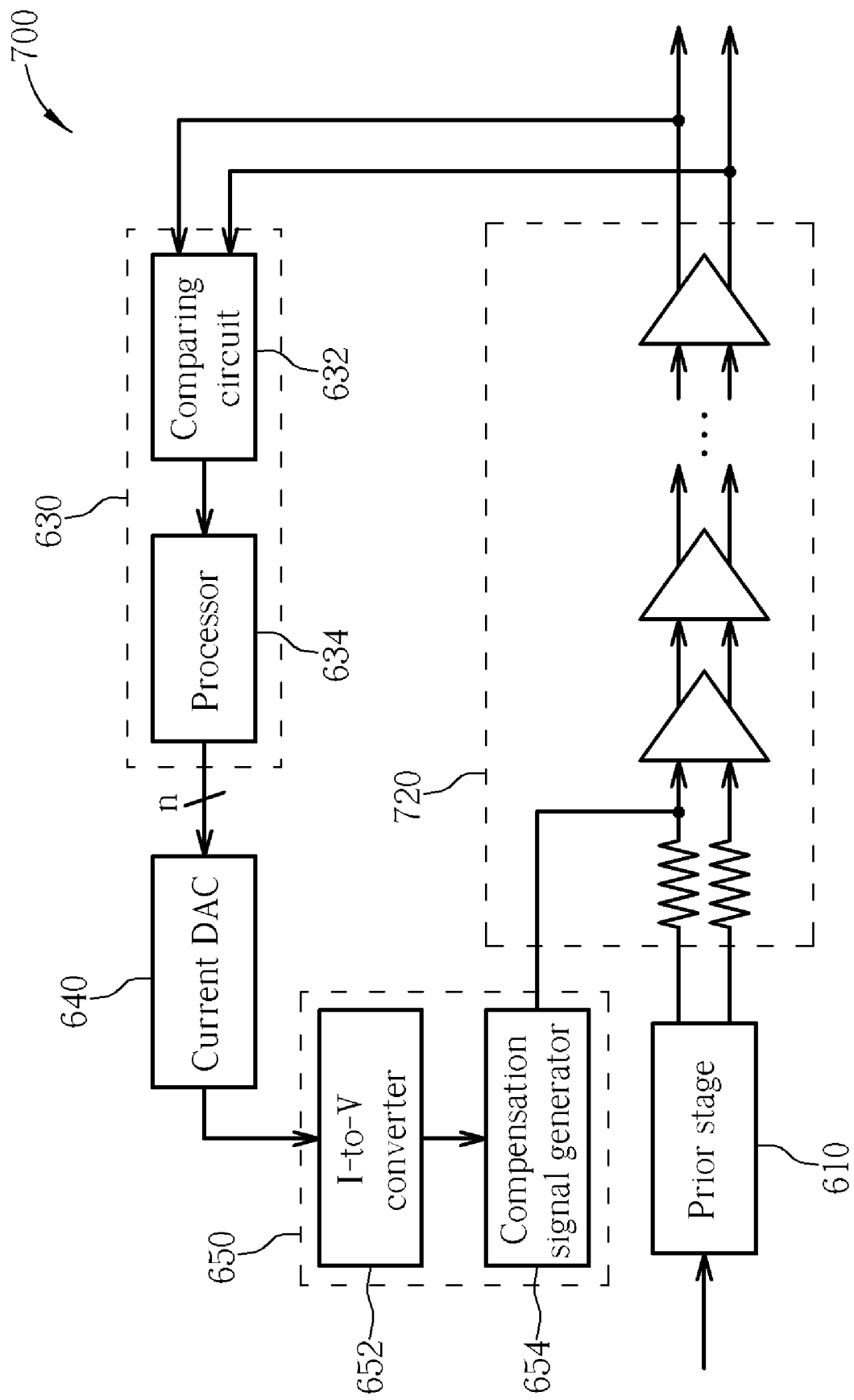
FIG. 7 is a simplified block diagram of a signal receiver applying a DC offset calibration device according to a fourth embodiment of the present invention.

For example, FIG. 7 shows a simplified block diagram of a signal receiver 700 that applying the DC offset calibration device according to a fourth embodiment of the present invention. As shown, a gain stage 720 of the signal receiver 700 comprises a plurality of differential gain stages. In practice, the plurality of differential gain stages of the gain stage 720 may have different implicit functionalities. In FIG. 7 and FIG. 6, components that labeled with the same number have substantially the same operations and implementations so that further details are omitted.

Figure 8:
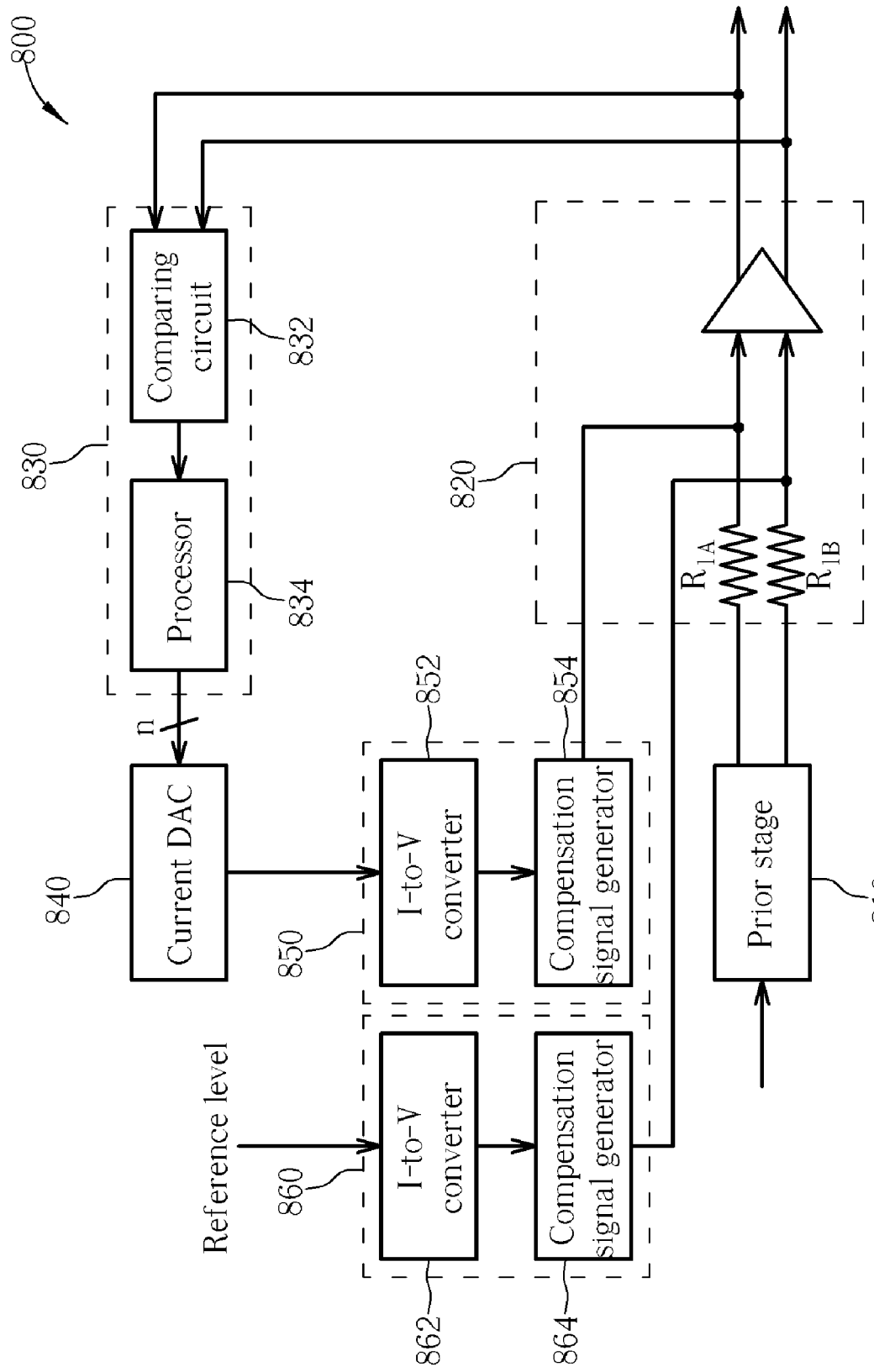
FIG. 8 is a simplified block diagram of a signal receiver applying a DC offset calibration device according to a fifth embodiment of the present invention.

FIG. 8 depicts a simplified block diagram of a signal receiver 800 that applying a DC offset calibration device with two I-to-I converters according to a fifth embodiment of the present invention. The signal receiver 800 comprises a prior stage 810 and a differential gain stage 820. In this embodiment, a DC offset calibration device comprises a control circuit 830, a current DAC 840, a first I-to-I converter 850, and a second I-to-I converter 860. The gain stage 820 can be various kinds of differential gain stages or it may comprise a plurality of differential gain stages. In this embodiment, the control circuit 830 comprises a comparing circuit 832 and a processor 834. The first I-to-I converter 850 comprises an I-to-V converter 852 and a compensation signal generator 854 while the second I-to-I converter 860 comprises an I-to-V converter 862 and a compensation signal generator 864. The comparing circuit 832 of the control circuit 830 is arranged for comparing the two differential signals output from the gain stage 820 to measure the DC offset at the output of the gain stage 820. The processor 834 is utilized for generating a digital control signal according to the compared result of the comparing circuit 832. Similar to the previously embodiments, the digital control signal is employed to control the current DAC 840 to generate a corresponding current. The first I-to-I converter 850 then converts the current from the current DAC 840 into a first compensation signal that having a higher resolution by utilizing the I-to-V converter 852 and the compensation signal generator 854. The first compensation signal is applied to one of the two differential signal inputs of the gain stage 820.

The first I-to-I converter 850 may itself has DC offset current at its output. The DC offset current of the first I-to-I converter 850 is typically slight but still possible to shift the effective working range of circuitry posterior to the gain stage 820, such as an analog-to-digital converter (ADC). In view of this, the DC offset calibration device of this embodiment utilizes the second I-to-I converter 860 to generate a second compensation signal according to a reference current. The second compensation signal is applied to the other differential signal input of the gain stage 820 to balance the DC offset current of the first I-to-I converter 850. In practice, the reference current level can be set to zero. Preferably, for minimizing the effect induced by the DC offset current of the first I-to-I converter 850, the I-to-V converter 862 of the second I-to-I converter 860 and the I-to-V converter 852 of the first I-to-I converter 850 are designed to have the same current-to-voltage conversion characteristics. Additionally, the compensation signal generator 864 and the compensation signal generator 854 can be designed to have the same voltage-to-current conversion characteristics. For example, the compensation signal generator 864 and the compensation signal generator 854 can be implemented with two resistors having identical resistance, respectively.

Figure 9:
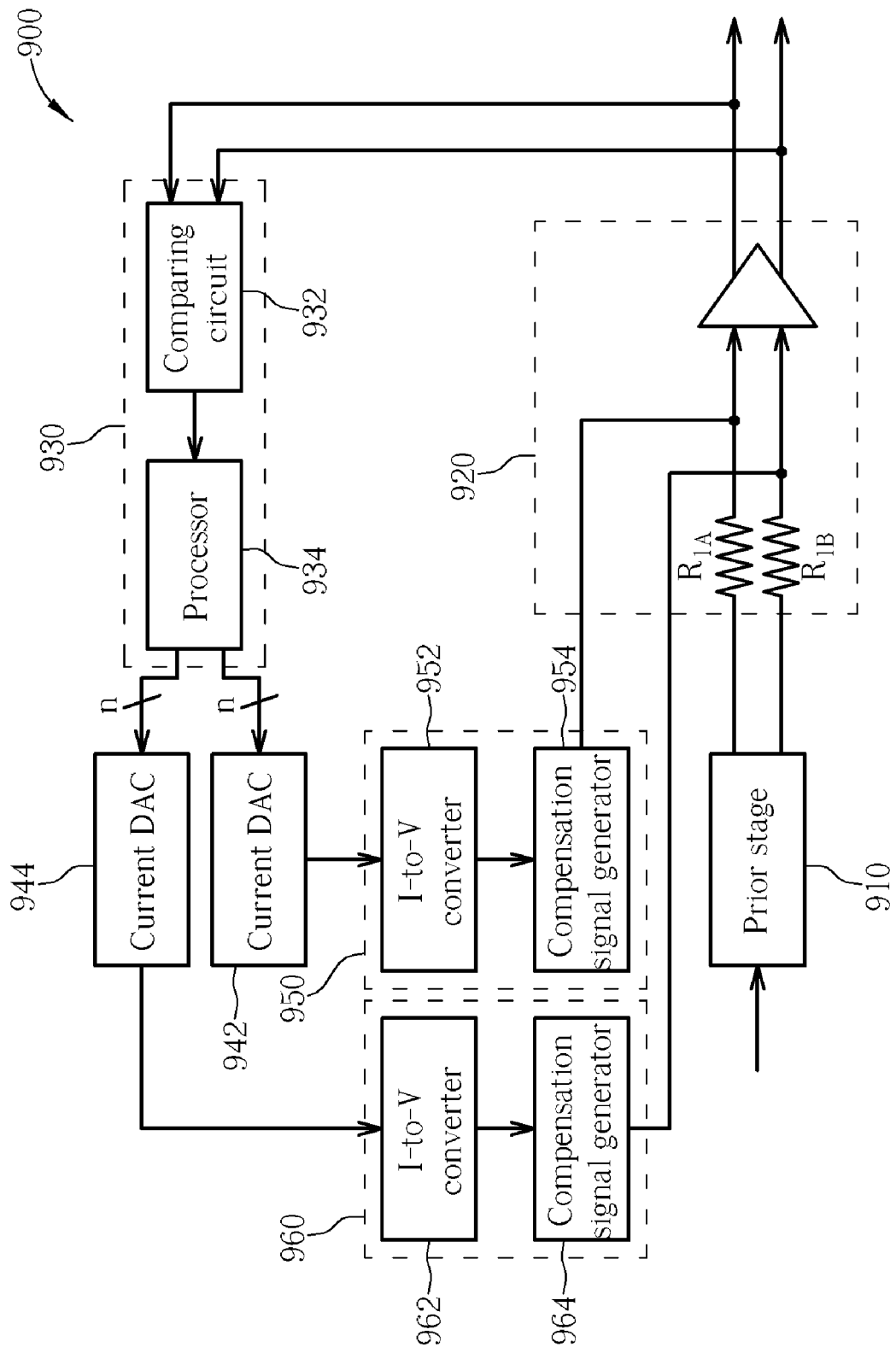
FIG. 9 is a simplified block diagram of a signal receiver applying a DC offset calibration device according to a sixth embodiment of the present invention.

FIG. 9 shows a simplified block diagram of a signal receiver 900 that applying a DC offset calibration device with two current DACs. Similar to the fifth embodiment mentioned above, the signal receiver 900 comprises a prior stage 910 and a differential gain stage 920. In this embodiment, a DC offset calibration device comprises a control circuit 930, a first current DAC 942, a second current DAC 944, a first I-to-I converter 950, and a second I-to-I converter 960. The control circuit 930 comprises a comparing circuit 932 and a processor 934. The first I-to-I converter 950 comprises an I-to-V converter 952 and a compensation signal generator 954. The second I-to-I converter 960 comprises an I-to-V converter 962 and a compensation signal generator 964.

As in the foregoing embodiments, if the I-to-V converter 952 and the I-to-V converter 962 have identical current-to-voltage conversion characteristics and the compensation signal generator 954 and the compensation signal generator 964 have identical voltage-to-current conversion characteristics, then the working range shifted by the DC offset current of the first I-to-I converter 950 and by the DC offset current of the second I-to-I converter 960 can be balanced to be minimum. Similarly, the compensation signal generators 954 and 964 can be implemented with two identical voltage-to-current converters, respectively, such that the two resistors have identical resistance.

Different from the embodiment shown in FIG. 8, two current DAC 942 and 944 are employed in this embodiment. In this embodiment, the processor 934 of the control circuit 930 generates a first control signal and a second control signal according to the comparison result of the comparing circuit 932. The first control signal is employed to control the current DAC 942 and the second control signal is employed to control the current DAC 944. The current DAC 942 generates a first current to the first I-to-I converter 950 according to the first control signal. The current DAC 944 generates a second current to the second I-to-I converter 960 according to the second control signal. In this embodiment, since the gain stage 920 is a differential gain stage, the effect of increasing a certain current to one of the two differential signal inputs of the gain stage 920 is substantially the same as the effect of decreasing the certain current from the other signal input of the gain stage 920. Accordingly, the processor 934 can simply set all bit values of the second control signal to be the opposite value of all the bit values of the first control signal.

For example, suppose that both the current DAC 942 and the current DAC 944 are implemented with the embodiment shown in FIG. 2. When the processor 934 sets the MSB of the first control signal to 1, the processor 934 can accordingly set the MSB of the second control signal to 0. On the contrary, if the processor 934 sets the MSB of the first control signal to 0, then the MSB of the second control signal can be accordingly set to 1. In addition, the implementations of the current DAC 942 may differ from the current DAC 944. Any architecture employing two current DACs in conjunction with two current-to-current converters to calibrate the DC offset of the gain stages should be included in the embodiments of the present invention.

Figure 10:
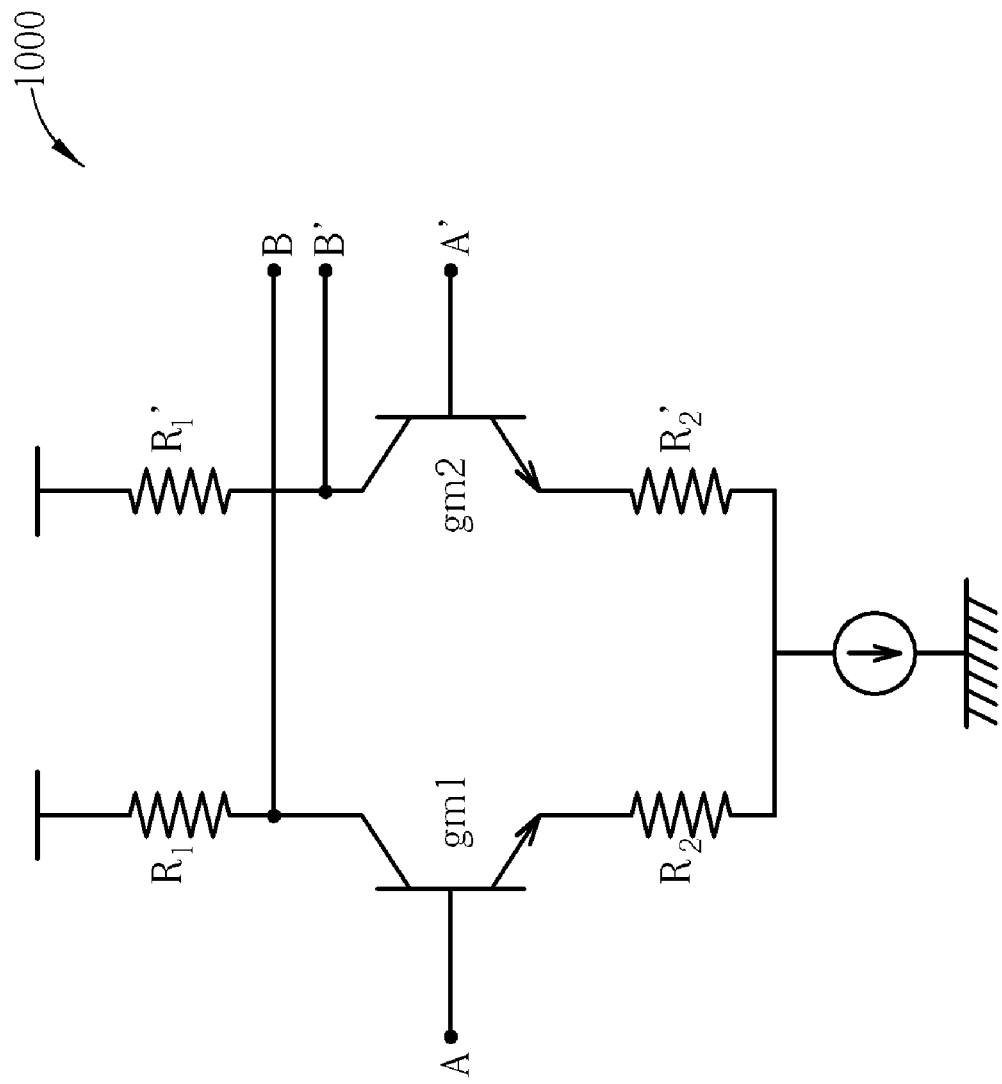
FIG. 10 is a schematic diagram of a differential gain stage according to another embodiment of the present invention.

Note that the differential gain stages of the foregoing embodiments are not limited to be realized with OP-amplifier architectures. By way of example, FIG. 10 shows a schematic diagram of a differential gain stage 1000 according to another embodiment of the present invention. The foregoing DC offset calibration devices can apply the compensation signals generated by the I-to-I converters to the differential input terminal A and A' or the load terminal B and B' of the differential gain stage 1000 to calibrate the DC offset within signals output from the differential gain stage 1000.

As in the foregoing descriptions, the DC offset calibration device of the present invention utilizes the I-to-I converter to convert the output current generated by the current DAC into the voltage domain. The I-to-I converter then converts the voltage signal back to the current domain to produce compensation signals. Additionally, while the output current is being converted into the voltage domain, the signal scale is enlarged. Utilizing this conversion, the resolution of the compensation signals become finer than the resolution of the output current generated from the current DAC. As a result, the resolution requirement of the output signal of the current DAC can be significantly released and the implementation of gain stage could be down sized, thereby reducing the cost and area of the whole solution.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A device for calibrating a DC offset of a gain stage, the device comprising:
 a digital-to-analog converter (DAC) coupled to an output of the gain stage for converting a digital control signal to an offset current, wherein the digital control signal is in response to a DC offset at the output of the gain stage; and
 a current-to-current converter coupled between the DAC and an input of the gain stage for converting and reducing the signal scale of the offset current to form a compensation signal.

2. The device of claim 1, wherein the current-to-current converter comprises:
 a current-to-voltage converter coupled to the DAC for converting the offset current to an offset voltage; and
 a compensation signal generator coupled to the current-to-voltage converter and the input of the gain stage for generating the compensation signal according to the offset voltage.

3. The device of claim 2, wherein the compensation signal generator is a voltage-to-current converter.

4. The device of claim 3, wherein the voltage-to-current converter is a resistor unit.

5. The device of claim 1, further comprising a control circuit coupled between the output of the gain stage and the DAC for comparing the output of the gain stage with a reference level to generate the digital control signal.

6. The device of claim 1, wherein the output of the gain stage is differential signals output, and the device further comprises a control circuit coupled between the output of the gain stage and the DAC for comparing the differential signals output of the gain stage to generate the digital control signal.

7. A device for calibrating a DC offset of a gain stage, the device comprising:
 a digital-to-analog converter (DAC) for converting a digital control signal to an offset current, wherein the digital control signal is in response to a DC offset of an output of the gain stage;
 a first current-to-current converter coupled between the DAC and a first input of the gain stage for converting and reducing the signal scale of the offset current to form a first compensation signal; and a second current-to-current converter coupled to a second input of the gain stage for converting a reference current to a second compensation signal.

8. The device of claim 7, wherein the first current-to-current converter comprises:

a first current-to-voltage converter coupled to the DAC for converting the offset current to a offset voltage; and a first compensation signal generator coupled between the first current-to-voltage converter and the first input of the gain stage for generating the first compensation signal according to the offset voltage.

9. The device of claim 8, wherein the second current-to-current converter comprises:

a second current-to-voltage converter for converting the reference current to a reference voltage; and a second compensation signal generator coupled between the second current-to-voltage converter and the second input of the gain stage for generating the second compensation signal according to the reference voltage.

10. The device of claim 9, wherein the first or the second compensation signal generator is a voltage-to-current converter.

11. The device of claim 10, wherein the voltage-to-current converter is a resistor unit.

12. The device of claim 10, wherein each of the first and second compensation signal generators is a resistor unit.

13. The device of claim 12, wherein the first and second compensation signal generators have substantially the same resistance while the first and second current-to-voltage converters have substantially the same current-to-voltage conversion characteristic.

14. The device of claim 7, wherein the reference current is substantially zero.

15. The device of claim 7, wherein the output of the gain stage is differential signals output, and the device further comprises a control circuit coupled between the output of the gain stage and the DAC for comparing the differential signals output of the output of the gain stage to generate the digital control signal.

16. A device for calibrating a DC offset of a gain stage, the device comprising:

a first digital-to-analog converter (DAC) coupled to an output of the gain stage for converting a digital control signal to a first offset current, wherein the digital control signal is in response to a DC offset of the output of the gain stage;

a first current-to-current converter coupled between the first DAC and a first input of the gain stage for converting and reducing the signal scale of the first offset current to form a first compensation signal;

a second DAC coupled to the output of the gain stage for converting a digital control signal to a second offset current, wherein the digital control signal is in response to a DC offset of the output of the gain stage; and a second current-to-current converter coupled between the second DAC and a second input of the gain stage for converting and reducing the signal scale of the second offset current to form a second compensation signal.

17. The device of claim 16, wherein the first current-to-current converter comprises:

a first current-to-voltage converter coupled to the first DAC for converting the first offset current to a first offset voltage; and a first compensation signal generator coupled to the first current-to-voltage converter and the first input of the gain stage for generating the first compensation signal according to the first offset voltage.

18. The device of claim 17, wherein the second current-to-current converter comprises:

a second current-to-voltage converter coupled to the second DAC for converting the second offset current to a second offset voltage; and a second compensation signal generator coupled to the second current-to-voltage converter and the second input of the gain stage for generating the second compensation signal according to the second offset voltage.

19. The device of claim 18, wherein the first or the second compensation signal generator is a voltage-to-current converter.

20. The device of claim 19, wherein the voltage-to-current converter is a resistor unit.

21. The device of claim 18, wherein each of the first and second compensation signal generators is a resistor unit.

22. The device of claim 21, wherein the first and second compensation signal generators have substantially the same resistance while the first and second current-to-voltage converters have substantially the same current-to-voltage conversion characteristic.

23. The device of claim 16, wherein the output of the gain stage is differential signals output, and the device further comprises a control circuit coupled among the output of the gain stage, the first DAC, and the second DAC for comparing the differential signals output of the gain stage to generate the digital control signal.

* * * * *